United States Patent [19]

Blaese

[11] 4,155,092

[45] May 15, 1979

[54] OMNIDIRECTIONAL COMMUNICATIONS ANTENNA

[75] Inventor: Herbert R. Blaese, Chicago, Ill.

[73] Assignee: Avanti Research & Development, Inc., Addison, Ill.

[21] Appl. No.: 803,028

[22] Filed: Jun. 3, 1977

[51] Int. Cl.[2] .............................................. H01L 21/20

[52] U.S. Cl. ...................................... 343/799; 343/727

[58] Field of Search ................................ 343/741-744, 343/728, 855, 799, 727, 800, 728

[56] References Cited

U.S. PATENT DOCUMENTS

| | | | |
|---|---|---|---|
| 2,460,260 | 1/1949 | Kibler | 343/744 |
| 2,521,550 | 9/1950 | Smith | 343/742 |
| 3,971,031 | 7/1976 | Burke | 343/744 |

*Primary Examiner*—David K. Moore

*Attorney, Agent, or Firm*—Dressler, Goldsmith, Clement, Gordon & Shore, Ltd.

[57] ABSTRACT

An omnidirectional communications antenna for transmitting and receiving horizontally polarized waves and adaptable for transmitting and receiving vertically polarized waves. The antenna is adapted to be supported on a single mast. It may be dimensioned especially for use in the citizens band. The antenna utilizes a plurality of, and preferably three, elongated half wave length radiating elements supported on a mast in a horizontal coplanar array. A cam acting locking mechanism for easily and firmly securing an antenna to a mast, or the like, is also disclosed.

26 Claims, 12 Drawing Figures

FIG. 3
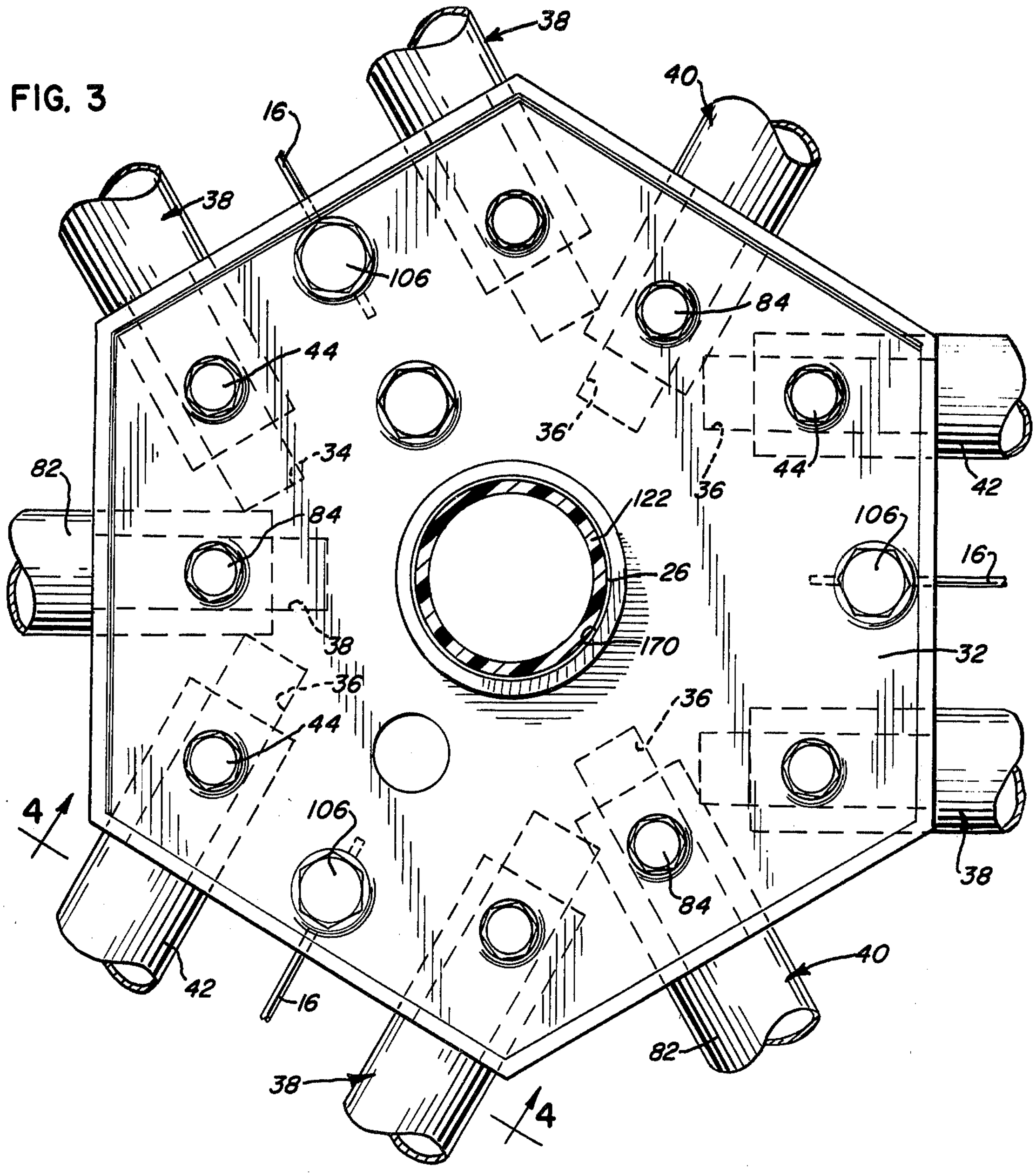
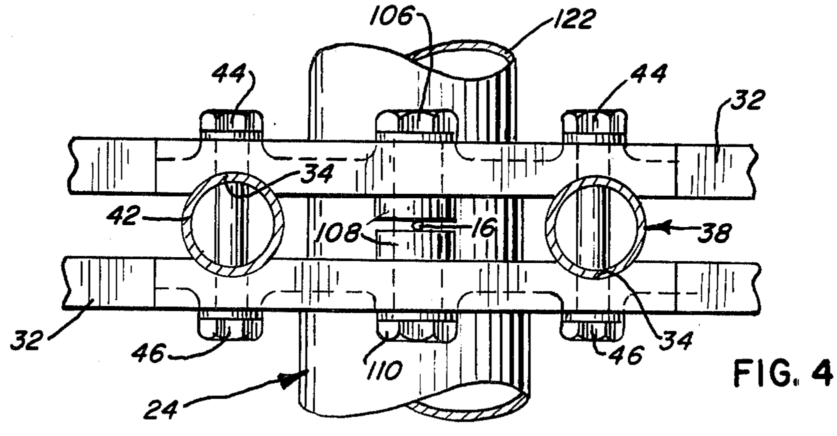
FIG. 4

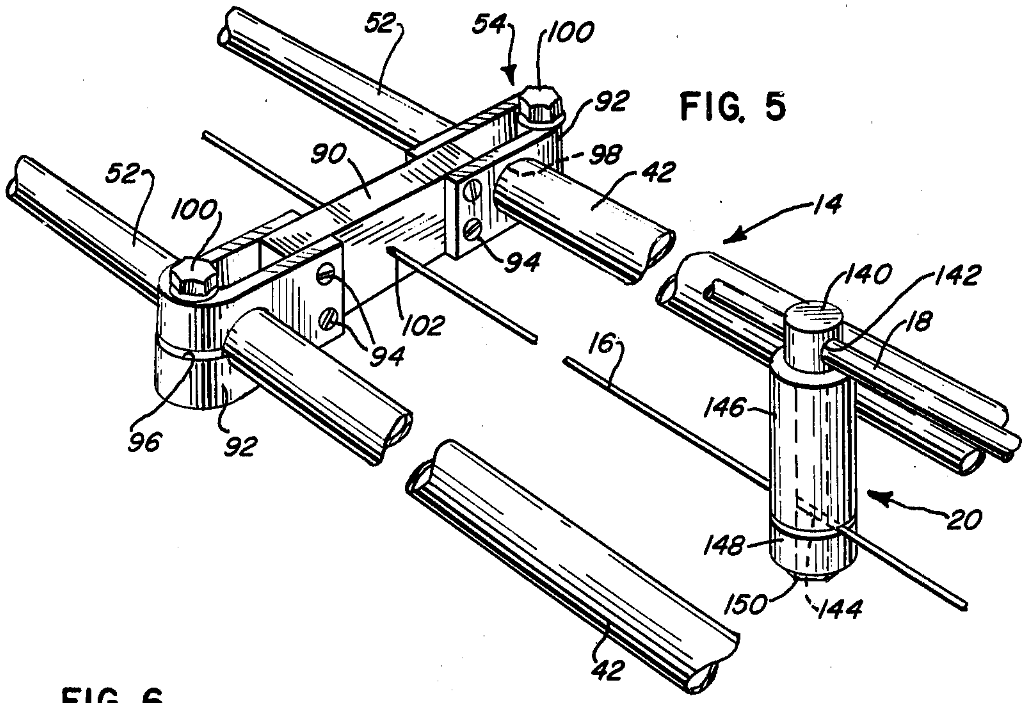
FIG. 5
FIG. 6
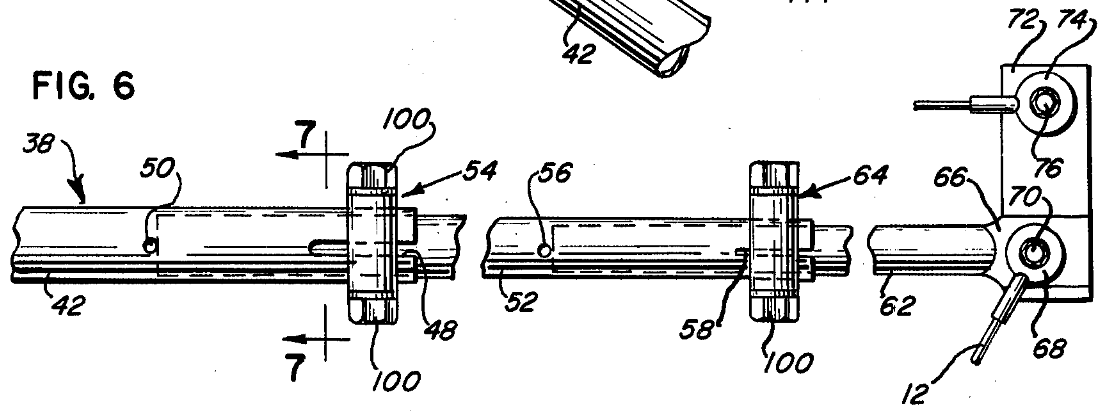
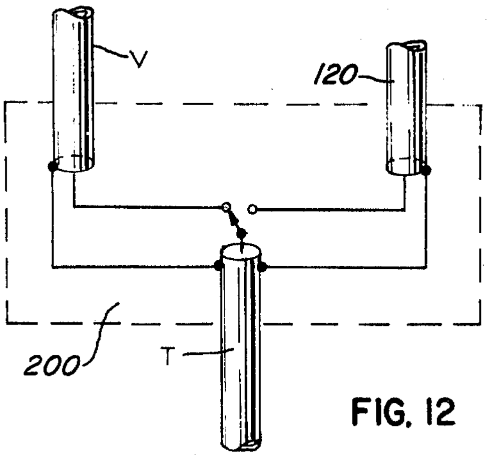
FIG. 12
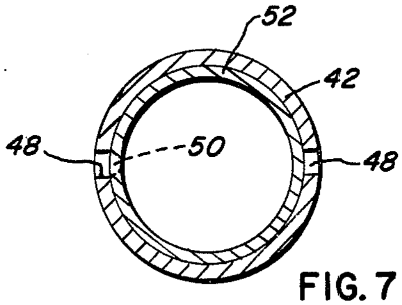
FIG. 7

FIG. 9
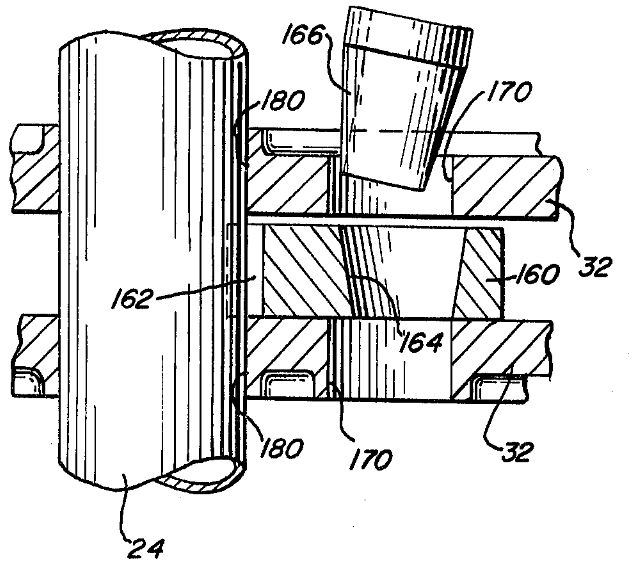
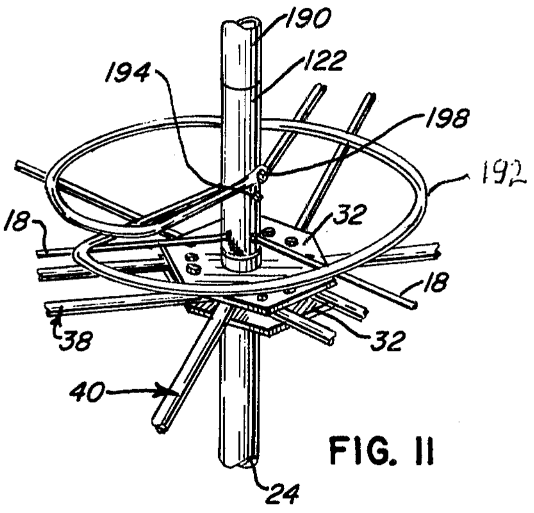
FIG. 11
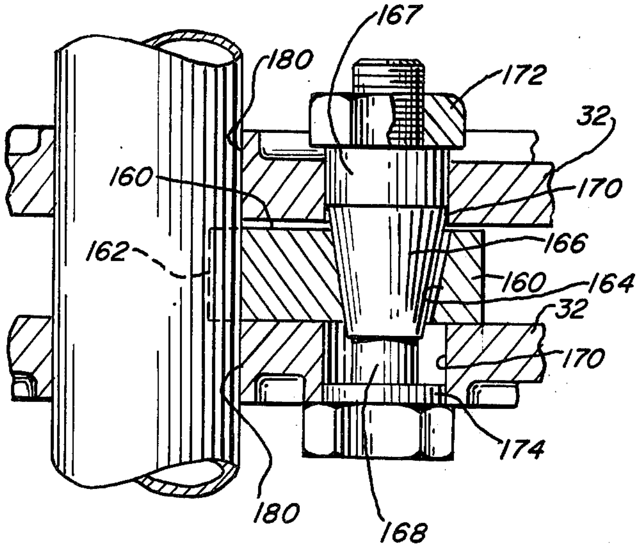
FIG. 10
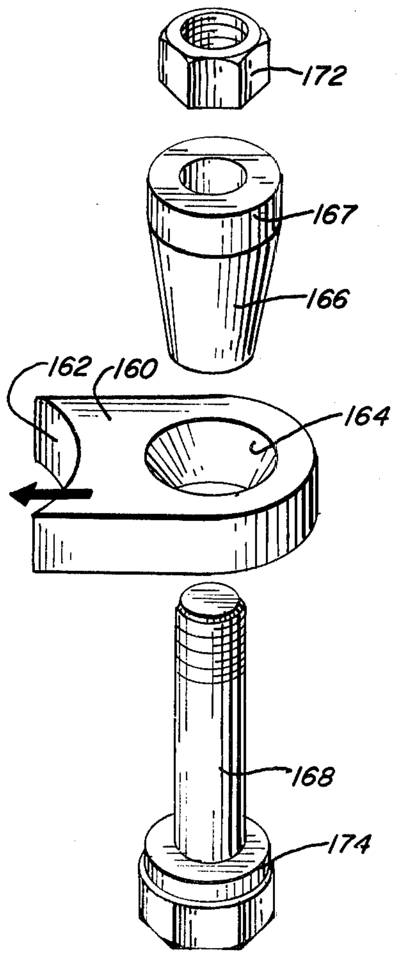
FIG. 8

OMNIDIRECTIONAL COMMUNICATIONS ANTENNA

BACKGROUND OF THE INVENTION

This invention relates to communications antennas used to enhance two-way communications, and particularly to those in the 27 megahertz citizens band (commonly referred to as CB antennas). They are especially useful in base station installations.

Radio waves are electromagnetic waves which are made up of electric and magnetic fields which are perpendicular to each other. These fields, in turn, are propagated in a direction perpendicular to the plane in which the fields exist. The electric field exists in the same plane that the electric conductor lies. If the conductor is perpendicular to the earth, the electric field therefore is vertical to the earth and the conductor is said to be vertically polarized. Similarly, if the conductor lies in a plane horizontal to a plane on the earth's surface, it will propagate its electric field in this plane and the conductor is said to be horizontally polarized.

It is necessary that the radiating conductor or antenna used for receiving a signal is polarized in the same plane as the plane in which the transmitting antenna propagates its signal. If the transmitting and receiving antennas are not so polarized, a pronounced loss of signal strength is experienced, often by as much as 15 decibels.

Ideally, it is desirable to use a directional or beam antenna to concentrate the available transmitted power in its "pointed" direction, i.e., the direction of the receiving station. However, if the operator is being called by a station lying in a direction outside of a beam antenna's sector of azimuth, the station might not be heard. To be heard, it is necessary for the operator to rotate the beam antenna, which must therefore be provided with a suitable rotary turning mechanism to attempt to pick up a station's call. By the time this has been done, the calling station may have stopped transmitting. Accordingly, both in CB and amateur radio communications, because most communications are from remote stations at unknown directions of azimuth, it is desirable to utilize omnidirectional receiving antennas so that signals from all azimuths are readily received, albeit at lower signal strengths than would be derived from beam antennas. Of course, an omnidirectional antenna may be used to receive a signal to "home" in on a transmitting station, following which a beam antenna may be used to obtain maximum signal strength.

Most beam antennas in current use in the high frequency spectrum, ranging from about 3 to about 30 megahertz, are horizontally polarized. Because the structures generally used to effect horizontal polarization in the omnidirectional mode are too large, the use of a separate omni antenna for establishing contact initially, following which the beam antenna is switched to, has not been as practical or as feasible as has been the use of vertical omni and vertical beam antennas.

Horizontally polarized beams are popular because they are relatively immune to picking up made-made noise that is randomly present in a vertically polarized mode. Vertically polarized antennas used for receiving suffer in this respect. Accordingly, the provision of a horizontally polarized omni antenna is highly desirable.

Further, because each station licensed for operation in CB and other amateur services operates on unassigned frequencies or channels within a defined spectrum of a respective narrow band, interference from other stations is often great. The introduction into the CB and amateur fields of a beam antenna by the assignee of the present application about eight years ago which made provision for optionally switching from horizontal to vertical polarity resulted in a dramatic change in the antenna selecting attitudes of, and possibilities available to the communicator. The success of that antenna was due to the ability of a station operator to switch from the vertical to the horizontal mode, if the other station antenna was similarly polarized or polarizable, when interference was rampant in a vertical mode. The provision now of an effective horizontally polarized omni antenna makes it possible to assist the communicator in homing in on a distant station and to use the preferred, and usually less crowded, horizontal polarization.

In the very popular citizens' band (CB) radio service, the assigned frequencies are in the eleven meter band (26.965 MH–27.405 MH). It requires no elaborate explanation to understand why vertically polarized antennas have been used. The difficulties of supporting a horizontal mobile antenna from vehicles such as automobiles where one-half the wave length is approximately 18 feet, are obvious. Indeed, the use of horizontal antennas even at base stations where antenna elements must be in the order of 18 feet in length is difficult.

While the simple vertical antenna inherently produces omnidirectional radiation, a simple antenna, such as a dipole disposed horizontally does not produce usable omnidirectional radiation. It produces bidirectional radiation instead. Omni-directionality of horizontally polarized waves is difficult to obtain easily and requires either more than a single antenna element or some supplemental technique, such as the rotation of an antenna element.

One approach to obtain horizontally polarized omnidirectional radiation would be to modify the simple dipole. For example, it is possible to fold the ends of the dipole to form a loop with the ends of the dipole spaced slightly apart. Such antennas have been constructed and are known as "halo" antennas. Such antennas do have some significant deficiencies, however. For example, the bandwidth becomes relatively narrow as a result of the amount of shortening required for omnidirectional operation. In addition, the gain of such antennas also appears to be reduced.

Another approach that has been taken is the clover leaf or "big wheel" multi-element antenna. In these structures, each of the leaf elements is a full wave length element, bent to form a half wave circumferential radiating segment with quarter-wave radial feeders, with each of the half-wave segments being end fed in phase. Unfortunately, these configurations are limited in size and, therefore, are used for higher frequencies because of structural limitations. Thus, the use of multiple or combined antenna elements to produce horizontally polarized radiation has presented significant physical and mechanical problems in the area of citizens' band frequencies.

In the eleven meter CB band, the approximate length of a half-wave length dipole antenna is equal to approximately eighteen feet. It therefore becomes clear that the construction of omnidirectional horizontally polarized antennas in the CB band presents significant structural problems directly related to the size of the antenna elements required in this frequency range. Further, while in some environments the utilization of a complex of separate antennas physically oriented in different directions to effectively provide the desired omnidirectionality may be possible, in most situations an antenna must be as compact as possible, should be physically integrated and should utilize minimal space. In most instances, it should be supported on a single supporting mast. These conditions particularly apply to CB antennas which are often installed in residential areas where the available space is restricted.

SUMMARY OF THE INVENTION

In accordance with the present invention, there is provided an omnidirectional communications antenna for transmitting and receiving horizontally polarized waves and which is also readily adapted for transmitting and receiving vertically polarized waves. An antenna incorporating the present invention is adapted to be supported on a single mast. It may be dimensioned especially for use in the citizens band.

An antenna in accordance with the present invention is capable of providing the desired omnidirectionality while at the same time providing horizontally polarized omnidirectional radiation with superior gain, the gain being equivalent to that obtained by using a five-eighth wave length ground plane vertically polarized antenna.

An antenna incorporating the present invention provides the desired horizontally polarized omnidirectional waves, and at the same time incorporates a mechanical construction which is relatively simple and strong. An antenna of this invention permits the use of structural connections at high stress points and eliminates the necessity of the presence of insulators at such stress points.

More specifically, an antenna incorporating the present invention utilizes a plurality of elongated antenna radiating elements, each being approximately one-half wave length long at an operating frequency for which the antenna is designed. The antenna radiating elements lie in a common, generally horizontal plane, are circumferentially spaced one from the other, and are spaced outwardly and at a distance from a central support or hub structure and from supporting means which are secured to the central hub structure and which extend outwardly therefrom. The arrangement of the plurality of antenna elements is such that when they are fed simultaneously, a horizontally polarized, omnidirectional radiation pattern which is of substantially uniform strength at all directions of azimuth is produced.

The radiating elements are secured at their ends on the supporting means. The supporting means preferably comprise radially extending arms which project outwardly from the central hub. The configuration of the antenna permits the use of light-weight flexible wire as the radiating elements. This is of advantage when it is understood that when the antenna is used in the CB band the antenna elements must be either 18 feet in length or must be loaded to an equivalent of 18 feet in length. When three such radiating elements are used in a triangular array or when each is bent so that the three elements form a hexagonal configuration, it will be apparent that the supporting arms will be about nine feet in length and that the antenna will be quite sizable.

When the radiating elements are bent at an angle of about 120 degrees so that three such "dipoles," each providing two quarter-wave length segments, form a hexagonal configuration, as compared to three such elements forming a triangular configuration, improved gain is obtained over a bandwidth, such as the CB bandwidth. This may be attributable to the fact that the high current points of the antenna elements are spaced apart farther than with the triangular configuration. In addition to that, when the bent dipoles are used, a stretcher arm reaching to the bend point of each dipole may be conveniently used to provide additional support. Because the bend point is the mid-point or zero voltage point as well, with the high voltage point being at the ends of the radiating elements, insulation between the stretcher arm and the radiating element is not necessary, simplifying the construction of the antenna assembly.

The configuration of antenna of this invention provides for the use of simple techniques for impedance matching of the transmission line to the radiating elements to optimize the operational characteristics of the antenna.

The omnidirectional antenna of the present invention may be suitably augmented so that it will selectively transmit and receive not only horizontally polarized waves, but also vertically polarized waves. To that end, the central hub structure may mount a vertical antenna member, such as a $\frac{5}{8}$ wave length vertical whip, which may selectively be used to transmit and receive vertically polarized signals. In that mode, the horizontal antenna array may be used as a ground plane for the vertical member. Because vertical antennas require ground plane antenna members, such as conventional radials, when used in the vertical mode, the present antenna does not take up substantially more space than conventional vertically polarized antennas, while having the advantage of providing means for transmitting and receiving horizontally polarized signals.

Thus, antennas of this invention may be used to produce horizontally polarized, omnidirectional signals. Because vertically polarized transmission is most common presently, where there are a great many users, transmission of horizontally polarized signals minimizes interference.

Other features and advantages of this invention will become apparent from the following description and drawings, of which:

FIG. 3 is an enlarged fragmentary view of the antenna assembly of FIG. 2, taken substantially along the line 3—3 of FIG. 2;

FIG. 4 is a side elevational view, partially in section, taken substantially along the line 4—4 of FIG. 3;

FIG. 5 is a fragmentary view of FIG. 1;

FIG. 6 is a fragmentary side elevational view of a portion of the antenna assembly of FIG. 1 with the right hand portion rotated 90° for ease of illustration;

FIG. 7 is a cross-sectional view, taken substantially along the line 7—7 of FIG. 6;

FIG. 8 is an exploded perspective view of the locking mechanism of the antenna assembly of FIG. 1;

FIG. 9 is a partially assembled view of the locking mechanism of FIG. 8;

FIG. 10 is an assembled view of the locking mechanism of FIG. 8;

FIG. 11 is a perspective view of the antenna of FIG. 1 supplemented with a showing of portions of a vertical antenna assembly; and FIG. 12 is a schematic showing of a selector assembly for horizontal and vertical moded operation.

Figure 1:
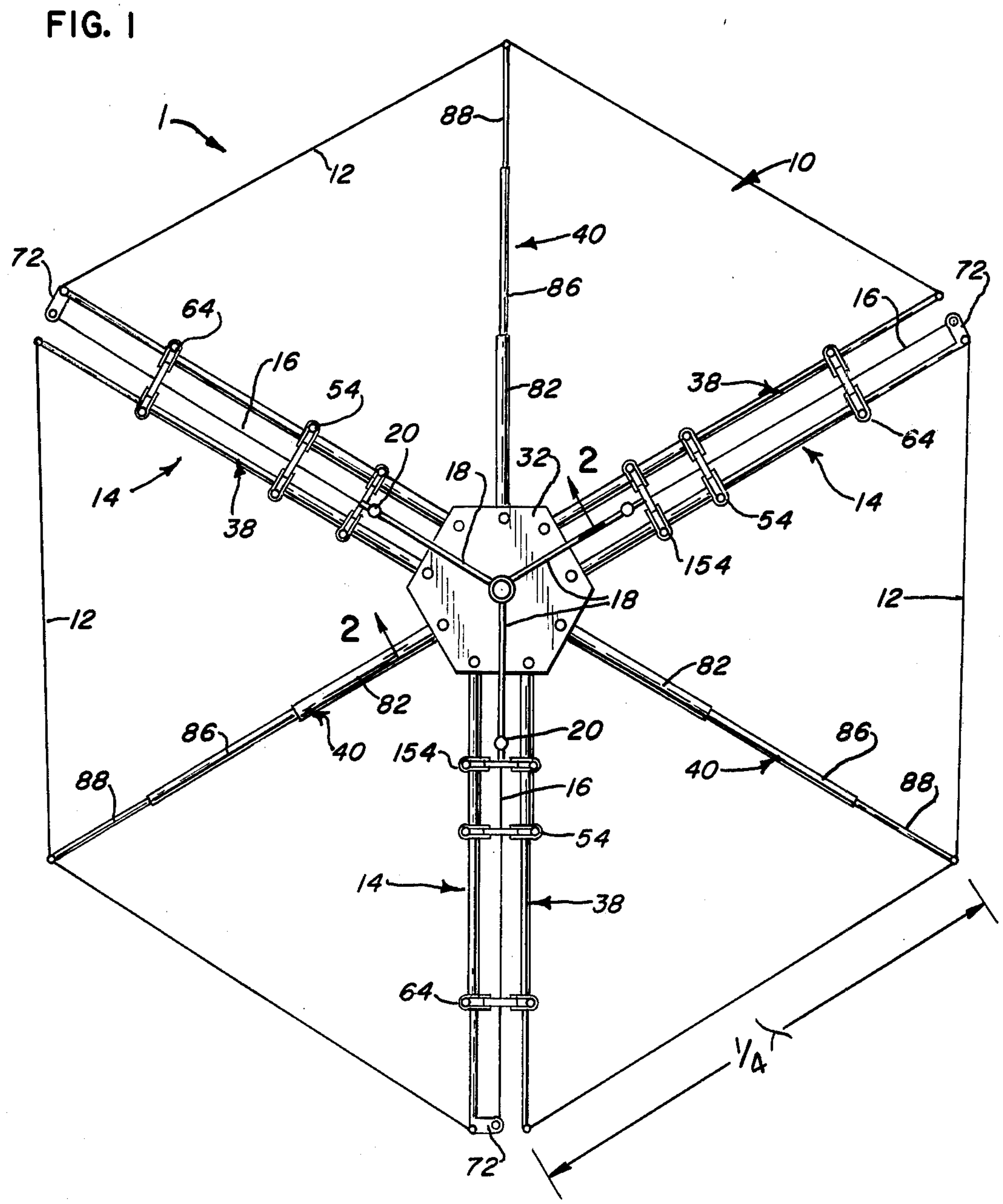
FIG. 1 is a plan view of an antenna assembly in accordance with this invention.

Referring now to the drawings, and particularly to FIGS. 1 to 10, an antenna 1 in accordance with this invention comprises a horizontally disposed, omnidirectional antenna assembly 10. Antenna assembly 10 incorporates three dipoles or half-wave length radiator elements, such as radiator wires 12. Each is approximately one-half wave length in length at the operating frequency for the antenna assembly which is about 18 feet in the CB range. Each of the radiator wires 12 is end or voltage fed in phase through an associated three-wire balun 14 which includes a feed wire 16. The baluns 14 are electrically in parallel and each feed wire 16 and associated balun 14 is matched to the feed line element 18 by an impedance tap 20 which is adjustable to feed the feed wire 16 at a proper location. Radiator wires 12 and feed wires 16 may desirably be 14-gauge copper wire.

Figure 2:
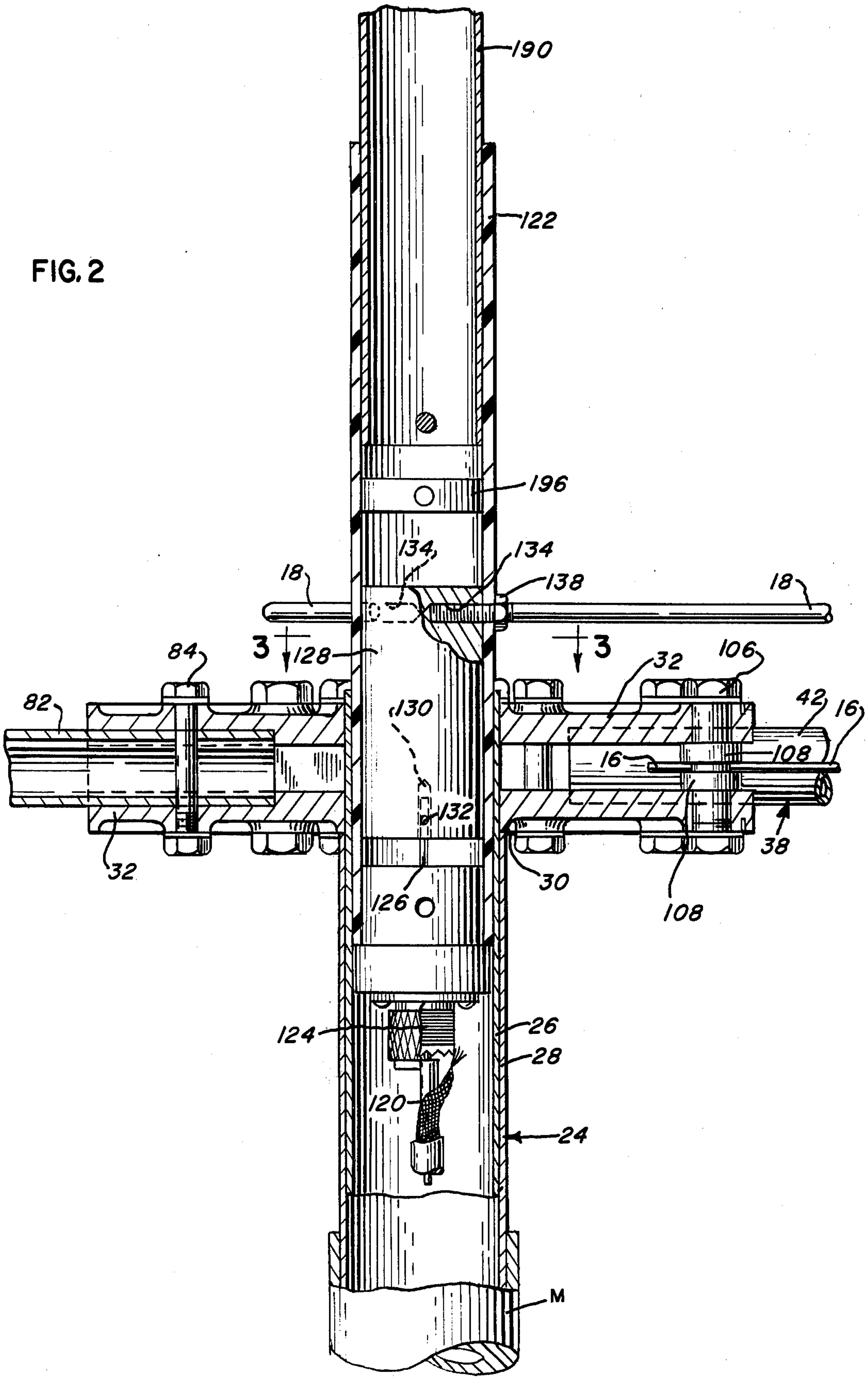
FIG. 2 is an enlarged fragmentary view of the antenna assembly, taken substantially along the line 2—2 of FIG. 1.

Antenna assembly 10 comprises a central hub structure or mounting assembly for suitably disposing and feeding the radiator elements with respect to a mast M (see FIG. 2). Mast M may be any suitable supporting structure. The central mounting assembly comprises a mounting tube 24 which may be formed of a pair of tubular members 26 and 28 which are suitably secured to each other as by riveting or welding and provides an upper shoulder 30 which is adapted to support and locate the central hub assembly.

The central hub assembly comprises a pair of hub members 32 which confront each other and which are suitably configured and formed to receive and clampingly mount the antenna elements.

As best seen in FIGS. 1 to 4, each hub member 32 defines a plurality of generally concave notches 34 and 36. Notches 34 and 36 are proportioned to complementarily receive suitable outwardly extending supporting means, such as balun arms 38 and stretcher arms 40, respectively.

Each of the balun arms 38 is preferably formed of a plurality of telescopic arm elements, one of which is secured at one end to the hub members 32, and the others of which are serially secured to opposite outer ends. As seen in FIGS. 1 to 4, each balun arm comprises a first balun arm member 42 having one end disposed within confronting notches 34. Arm members 42 define a bore through which a clamping bolt 44 passes and which, in association with clamping nut 46, serves both properly to locate and clamp arm member 42 with respect to hub members 32.

The other or outer end of balun arm member 42 is slotted at 48 and provides an inwardly extending dimple or stop element 50. As seen in FIG. 6, the second balun arm member 52 is received within balun arm member 42, is properly located lengthwise by stop element 50 and is clamped therein via a clamping assembly 54 which operates via slots 48, tightly to clamp arm members 42 and 52 to each other.

Similarly, the outer end of arm member 52 provides a stop element 56 and diametrically opposite slots 58 for longitudinally locating and receiving the third or outermost balun arm member 62. The second and third arm members 52 and 62 are clamped together via a clamp assembly 64. The outer ends of the third balun arm members 62 are preferably flattened and perforated to provide flattened ends 66, suitably to secure the radiator elements 12. Each radiator element 12 is desirably provided with an apertured terminal lug 68. Securing means such as suitable nuts and bolts 70 secure the radiator wires to the flattened ends 66.

A mounting plate bracket 72 is secured to one of each of the pairs of adjacent balun arms 38. Plate 72 is secured to an end 66 by the nuts and bolts 70 and provides a spaced aperture through which the associated feed wire lug 74 is secured to the plate 72, as by suitable nuts and bolts 76, thereby electrically to couple the associated feed wire 16 to one end of a radiator element 12. The other of the balun arms in the pair is similarly apertured and flattened, but serves only to mount the other end of the next adjacent radiator element 12 via its associated terminal lug 68.

Each of the radiator elements is centrally supported by a stretcher arm 40. Like each balun arm 38, each stretcher arm 40 is mounted to hub members 32 at one end and includes a first stretcher arm member 82 secured in complementary concave notches 36, as by clamping nuts and bolts 84. Each stretcher arm 40 desirably comprises two additional telescopic stretcher arm members 86 and 88 which, like balun arms 52 and 62, provide inwardly extending stop elements, such as dimples, which define slotted outer ends for the first and second stretcher arms, and which provides a flattened outer end for the third stretcher arm member for clamping securance, as by suitable threaded fasteners, of the associated radiator element. Suitable clamps (not shown) may be used to securely fix the stretcher arm members to each other adjacent their ends.

The radial extent of the stretcher arms 40 are substantially equal to those of the balun arms so that in plan view the radiator elements 12 resemble bent dipoles, each of which comprises a pair of integral quarter wave length segments which are at an angle of about 120° to each other. In plan view, the horizontal omnidirectional antenna array appears as a substantially regular, essentially closed hexagon. Although the hexagonal configuration makes the antenna assembly somewhat more compact and stable and produces omnidirectional radiation at a higher gain, it is also possible simply to use generally straight antenna elements supported at their ends so that when three dipoles are used the array is generally triangular in plan view and when four dipoles are used the array is generally square in plan view.

As indicated above, the hexagonal configuration of the antenna does have several advantages. Gain measurements indicate that the omnidirectional gain of such a structure is approximately equal to the gain achieved by a $\frac{5}{8}$ wave length antenna when compared to a simple dipole antenna. In addition, this gain is omnidirectional.

Limited measurements reveal that the bandwidth of the hexagonally-shaped configuration is also quite good, even when compared to the alternative triangular configuration. For example, in the CB band, the standing wave ratio of the multi-segmented hexagonally shaped antenna at the upper or lower channel appears to be no greater than 1.3:1–1.5:1; whereas the triangular antenna produces a standing wave ratio at either end of this frequency band of at least about 2:1. This apparent benefit appears to be derived from the greater spacing between the high current or zero voltage points in the hexagonally-shaped structure.

Each of the clamp assemblies 54 and 64 (which may be identical except for their physical dimensions and, accordingly, identical part numbers are used) includes a central insulating separator strap or bar 90 which may be formed of plastic, and a pair of clamp elements 92. The clamp elements 92 may be secured, as by rivets or by threaded fasteners 94, to bar 90. Each clamp element is formed with a slot 96 and a central bore 98 proportioned to closely, but slidably receive the associated balun arm member which is of the greatest diameter at the zone at which the clamp assembly is used. Suitable clamping nuts and bolts 100 are disposed in the zone of an associated slot 96 so that when the clamping nuts and bolts 100 are tightened, the associated slotted end of the balun arm member is closed sufficiently tightly to grip the telescopically received end of the associated balun arm member.

Each feed wire 16 extends from hub members 32 to an associated mounting bracket 72. Each feed wire 16 is secured at the hub members and is maintained in spaced, insulative relation to the balun arms by the clamp assemblies. To that end, each wire 16 passes through aligned bores 102 (FIG. 5) in separator bars 90. Adjacent its inner end, each feed wire 16 is clamped by a terminator assembly comprising an elongated headed element or bolt-like terminator 106 defining a diametral bore through which the end of feed wire 16 passes. A pair of bushings 108 slidably mounted on the terminator 106 confront an end portion of the wire 16 and adjustably clampingly engage wire 16 therebetween when terminator nut 110 is tightened on the threaded end of the terminator shank. As terminator nut 110 is tightened, the hub members 32 are biased and flexed inwardly slightly between the terminator head and nut, thereby forcing the confronting bushings 108 inwardly and into clamping engagement with the feed wire. The terminator clamp assembly is easily tightened and loosened so that during and after assembly of the antenna the feed wire may be made suitably taut, without damaging its end.

The antenna assembly may be fed with a signal to be transmitted from a conventional transmission line, such as from a coaxial cable 120. A support tube 122, which may be a fiberglass or other insulative tube member, is fitted with a suitable coaxial cable connector 124 to which the end of the coaxial cable is threadedly connected (see FIG. 2). The center wire 126 of the coaxial cable extends from connector 124 to a contact insert 128 and is desirably held in a bore 130 therein, as by a set screw 132. Contact insert is preferably of solid aluminum and functions as a capacitor desirably providing 46 picofarads of capacitance to assist in properly matching the transmission line to the feed lines.

Contact insert 128 defines three radially oriented tapped bores 134, each of which is adapted to receive a radially extending feed rod 18. Each feed rod 18 is threaded in place through an aligned opening in the support tube 122 and is locked to support tube 122 by a nut 138.

Each feed rod 18 extends over and generally parallel to an associated feed wire 16, thereby to provide feed connecting means extending from the central hub structure to an end of an associated antenna element. A longitudinally adjustable impedance matching means, impedance tap 20, is provided so that each of the baluns is matched to the impedance of the transmission line which conventionally is about 50 ohms. If there is substantial unbalance (poor matching), within the range of the bandwidth the capacity of the antenna to function at a power output level which is otherwise near the capability of the antenna will be adversely affected.

The impedance tap 20 comprises an elongate impedance wire clamp stud 140 which defines a first feed rod bore 142 and a second feed line bore 144. An impedance wire clamp bushing or sleeve 146 is disposed on the shank of stud 140 between bores 142 and 144, a bushing or spacer 148 is disposed below the bore 144 and a nut 150 is threadedly secured to the end of the shank of stud 140. When nut 150 is tightened, both the feed wire 16 and feed rod 18 are clampingly secured in place, the rod 18 by the sleeve 146 which is urged against it and the wire 16 by the members 146 and 148 which clampingly engage it. Rod 18 serves to stop or limit sliding movement of sleeve 146, much as the head of terminator 106 restrains movement of the terminator bushings. By loosening nut 150, the stud 140 may be slid longitudinally of the feed wire 16 until each balun 14 is suitably impedance-matched to the transmission line. Of course, it is important to the proper functioning of the antenna that the impedance be closely matched to that of the transmission line.

To provide for proper stability and spacing of the balun assemblies, a third clamp assembly 154, like clamp assemblies 54 and 64 in all respects, may be provided for each of the balun assemblies.

To secure the hubs and associated elements to mounting tube 24, a cam-acting lock mechanism is provided. Although this is shown as being mounted to the hub members 32 for securance to the tube 24, it will be apparent that it can be otherwise mounted to an antenna element for securance of an antenna element to a mast or other support.

The particular cam-acting locking mechanism illustrated comprises a hub lock plate 160 slidably disposed between hub members 32. Lock plate 160 defines a locking face 162 which is configured and adapted to bear against an external surface of mounting tube 24. When it bears strongly against an external surface, it resists relative movement. Lock plate 160 also defines a central bore 164 which may be frustoconical in transverse cross-section.

The locking mechanism further comprises a tapered lock plug 166 which may have a frustoconical configuration which is complementary to that of the central bore 164. Plug 166 defines a central bore adapted to receive a lock bolt 168. Lock bolt 168 passes through a pair of aligned openings 170 in hub members 32. Openings 170 and bore 164 are positioned relatively so that when nut 172 and bolt 168 cooperate to drive tapered lock plug 166 downwardly into mating engagement with bore 164, via tightening of nut 172, lock plate surface or face 162 is reciprocatably forced slightly inwardly of the central openings 180 in hub members 32. Centering shoulder 174 serves to center the bolt 168 with respect to the lower hub member 32. The shoulder 167 of plug 166 centers the plug with respect to the upper hub member bore 170. Nut 172 adjustably drives plug 166 downwardly to provide the proper clamping force at face 162. As such, the close fitting mounting tube 24 is tightly engaged by face 162 of the lock plate, thereby securely to mount and lock the assembled hub members 32 to the mounting tube 24 but without undue distortion of the external surface against which lock plate face 162 bears.

It will be seen that the mechanical construction of the antenna assembly is relatively simple, but strong. Virtually all connections are metal-to-metal, thereby eliminating the need for electrical insulators at high stress points of connection. Indeed, the only insulators, other than the support tube 122, are the separator bars 90 which bridge clamp elements 92. Those clamp assemblies 54, 64 and 154, not only serve to insulate the balun elements from each other, but also function to maintain the balun arms equally separated and rigid and to clamp the balun arm members to each other, eliminating the necessity of separate tubing clamps. The overall construction, which is of the knock-down type, is easy to assemble and provides a strong, sturdy construction, when assembled.

Desirably, the balun and spacer arms are of high strength aluminum tubing. The hub members 32 may be aluminum castings. The remaining components may be of aluminum or stainless steel. The use of such components produces a strong, weather-resistant construction.

The horizontal omnidirectional antenna assembly 10 may be used in association with a vertical radiator as well. To that end, a vertical radiator 190, which may be ⅝ wave length in length (or the electrical equivalent) is secured to support tube 122. A matching loop 192 is connected to the vertical radiator via a threaded fastener 194. The other end of the loop 192 is electrically connected to a contact plug 196, as by a threaded fastener which passes through support tube 122. Loop 192 is fed, as by a pigtail which is also connected to contact plug 196 at one end. Its other end is connected to a further coaxial cable connector (not shown) which may be suitably supported on one of the hub members 32. A vertical feed transmission line V (FIG. 12) is secured to the connector, thereby to feed the vertical radiator 190. Other vertical antenna configurations may be used as well, such as, for example, a one-quarter wave length vertical antenna.

The horizontal antenna assembly 10 may be used independently of the vertical radiator as a horizontally oriented omnidirectional antenna. Alternatively, it may be used in association with the vertical radiator, such as radiator 190, and may serve as a ground plane for the vertical radiator. It is believed that both the horizontal antenna assembly and vertical radiator may be fed simultaneously and in phase to produce an omnidirectional signal which is polarized at an incline or angle of about forty-five degrees to the horizontal. The provision of yet another mode of operation would have obvious advantages.

For purposes of selecting the transmitting (and receiving) mode of the antenna, i.e., horizontal or vertical, a suitable selector means or switch box 200 (FIG. 12) may be provided to select the desired operational mode for the antenna, thereby to feed either the vertical or the horizontal radiators from the radio transmission line T. A further switch for selecting an inclined mode may also be provided.

It should be noted that the horizontal antenna members have been illustrated as being generally bent dipoles. They may, however, be straight as well or may be shorter if suitably loaded to act as a half-wave length antenna. Where they are formed of self-supporting materials, instead of wire, they may be curved or arcuate in shape rather than of substantially straight segments.

Although only a single presently preferred embodiment of the present invention has been illustrated and described in detail, i.e., one especially useful in the citizens band range, it will be apparent to those skilled in the art that modifications and additional usages may be made without departing from the spirit and scope of the invention. Accordingly, my invention is intended to be limited only in accordance with the appended claims.

I claim:

1. An omnidirectional communications antenna for transmitting and receiving horizontally polarized signals, a central hub structure, supporting means secured to said central hub structure and extending outwardly therefrom, a plurality of elongated dipole antenna members, each being approximately one-half wave length in length at an operating frequency for said antenna, spaced around and outwardly of and entirely at a distance from said central hub structure and each lying in a generally horizontal plane, each said antenna member being secured at its ends to said outwardly extending supporting means at points spaced at a distance from said hub, and means for feeding one end of each of said antenna members with a signal to be transmitted thereby including feed connecting means extending outwardly from said central hub structure to said one end of each of said antenna members for feeding, in phase, said one end of each of said antenna members with a signal to be transmitted thereby.

2. An omnidirectional communications antenna in accordance with claim 1 wherein each of said antenna members is of a length approximately equal to one-half wave length of waves in the range of citizens band frequencies.

3. An omnidirectional communications antenna in accordance with claim 1, wherein each said antenna member is an end-fed dipole.

4. An omnidirectional communications antenna in accordance with claim 3 wherein said dipoles are three in number, each of which is bent at its center at an angle of about 120° into a pair of segments which are each about one-quarter wave length in length at said operating frequencies for said antenna, each of said dipoles lying in a substantially common, horizontal plane.

5. An omnidirectional communications antenna in accordance with claim 3 wherein said supporting means comprises arm means extending outwardly from said hub structure, said arm means comprising arms for securing and supporting the ends of said dipoles and stretcher arms for supporting each said dipole at its center.

6. An omnidirectional communications antenna in accordance with claim 4 wherein said dipoles are disposed to define a substantially regular, essentially closed hexagonal configuration when viewed in said horizontal plane, with said hub structure being located substantially centrally of said hexagonal configuration.

7. An omnidirectional communications antenna in accordance with claim 6 wherein each of said dipole segments is approximately one-quarter wave length in length.

8. An omnidirectional communications antenna in accordance with claim 1 wherein said supporting means and feed connecting means comprise balun assemblies, each said balun assembly comprising arm means extending outwardly from said hub structure and an elongated feed member, each said feed member being electrically coupled to said one end of a said antenna member, and wherein said arm means support said feed members and said antenna members.

9. An omnidirectional communications antenna in accordance with claim 8 wherein each said balun assembly is a three-wire balun, and wherein said feed member is a wire member and said arm means comprise a pair of arms secured to and extending outwardly from said hub structure, one of said pair of arms supporting one end of one of said antenna members and the other of said pair of arms supporting the other end of a next adjacent antenna member, the number of said pairs of arms being equal to the number of antenna members.

10. An omnidirectional communications antenna in accordance with claim 9 wherein each said pair of arms is clamped in spaced relation to each other and wherein said wire member is insulatively mounted in spaced relation to said arms.

11. An omnidirectional communications antenna in accordance with claim 10 wherein said feed connecting means further comprises an elongate feed element extending outwardly from the center of said central hub structure, said feed element being electrically connected at one end to said feed means and at the other end to said feed wire outwardly of said hub structure.

12. An omnidirectional communications antenna in accordance with claim 11, and further comprising an impedance tap which is movable inwardly and outwardly with respect to said feed element and said feed wire, thereby to provide for matching the impedance of each of said feed wires to said feed means.

13. An omnidirectional communications antenna in accordance with claim 1 and further characterized by a vertical antenna member extending vertically upwardly from said hub structure, second feed connecting means for feeding said vertical antenna with a signal to be transmitted thereby, and selector means for selectively feeding said vertical antenna and said antenna members, in phase, simultaneously to produce an omnidirectional signal polarized at an angle inclined to the horizontal in a second mode of operation of said communications antenna, and for feeding only said vertical antenna while utilizing said antenna members as a ground plane for said vertical antenna in a third mode of said communications antenna.

14. An omnidirectional communications antenna in accordance with claim 1, wherein said feed connecting means each comprises a feed wire extending outwardly from said central hub structure to one end of a said antenna member, and further comprising means for adjustably clampingly engaging a portion of said wire intermediate its ends without damaging said portion, said clamping means comprising an elongate element defining a lateral bore therethrough and having a threaded end portion, said wire extending through said bore, a pair of bushing members slidably disposed on said elongate element on opposite sides of said bore, stop means associated with said elongate element at the end opposite said threaded end for restraining sliding movement of said bushing members, and nut means threaded on said threaded end portion, whereby when said nut means is tightened, said bushing members clampingly engage said feed wire portion therebetween without damaging the clamped feed wire portion.

15. An omnidirectional communications antenna assembly in accordance with claim 14 wherein said stop means comprises a head portion of said elongate element, and wherein said elongate member is supported on said hub assembly to clampingly engage the portion of said feed wire adjacent its end.

16. An omnidirectional communications antenna assembly in accordance with claim 14 and wherein said stop means comprises a feed element for said antenna member, said bushing members clampingly engage said feed wire, and wherein said clamping means comprises an adjustable impedance tap for matching the impedance of the feed wire to a transmission line, and wherein said elongate element defines a second lateral bore slidably receiving said feed element, whereby when said nut means is tightened, the bushing members clampingly engage said feed wire portion and one of said bushing members clampingly engages said feed element to restrain movement of said elongate element with respect to said feed element.

17. An omnidirectional communications antenna for transmitting and receiving horizontally polarized signals at operating frequencies in the range of citizens band frequencies comprising:

three antenna members, each being approximately one-half wave length in length at an operating frequency for said communications antenna, and disposed horizontally and in a generally triangular coplanar array, a hub structure positioned centrally of said generally triangular configuration, a coaxial cable for feeding signals to said antenna members, a three-wire balun for each of said antenna members, each said three-wire balun comprising a pair of support arms secured to and extending outwardly from said hub structure and a feed wire extending outwardly from said hub structure, and wherein said support arms insulatively support said feed wire along its length and support a first end of one of said antenna members and a second end of another of said antenna members, whereby said antenna members are supported in said triangular configuration, means electrically coupling the outermost end of each of said feed wires to one of said first ends, and feed connecting means for coupling each of said feed wires, in phase, to said coaxial cable, thereby to end feed each of said antenna members, in phase, at each of said ends.

18. An omnidirectional communications antenna in accordance with claim 17 and wherein each of said feed means comprises a feed element extending outwardly from said hub structure, and an outwardly adjustable impedance tap slidable with respect to a said feed element and a said feed wire for coupling said feed means and said feed wire and for matching the impedance of each said feed wire to the impedance of the coaxial cable.

19. An omnidirectional communications antenna in accordance with claim 17 and further characterized by stretcher arms secured to and extending outwardly from said hub structure, and wherein each of said stretcher arms extends to about the center of an antenna member, thereby to support said antenna member intermediate its length.

20. An omnidirectional communications antenna in accordance with claim 19 wherein each said antenna member is a bent dipole, each of the elements of each said dipole being approximately one-quarter wave length in length at an operating frequency for said antenna, wherein said stretcher arms support said bent dipoles at their centers, and wherein said triangular array presents a generally hexagonal appearance in plan view.

21. An omnidirectional communications antenna in accordance with claim 17, further characterized by clamp means, each said clamp means clampingly securing a said pair of said support arms in adjacent, spaced relation, and insulatively supporting said feed wire in insulated spaced relation to said support arms.

22. A communications antenna assembly including an elongate wire member, and means for adjustably clampingly engaging a portion of said wire intermedite its ends without damaging said portion, said clamping means comprising an elongate element defining a lateral bore therethrough and having a threaded end portion, said wire member extending through said bore, a pair of bushing members slidably disposed on said elongate element on opposite sides of said bore, stop means associated with said elongate element at the end opposite said threaded end for restraining sliding movement of said bushing members, and nut means threaded on said threaded end portion, whereby when said nut means is tightened, said bushing members clampingly engage said wire portion therebetween without damaging the clamped wire portion.

23. A communications antenna assembly in accordance with claim 22 wherein said stop means comprises a head portion of said elongate element.

24. A communications antenna assembly in accordance with claim 23, wherein said antenna assembly comprises a central hub assembly and said elongate member is supported on said hub assembly to clampingly engage the portion of said wire member adjacent its end.

25. A communications antenna assembly in accordance with claim 22 and further comprising an antenna member, and wherein said stop means comprises a feed element for said antenna member, said bushing members clampingly engage a feed wire which couples said feed element to said antenna member.

26. A communications antenna assembly in accordance with claim 25 and wherein said clamping means comprises an adjustable impedance tap for matching the impedance of the feed wire to a transmission line, and wherein said elongate element defines a second lateral bore slidably receiving said feed element, whereby when said nut means is tightened, the bushing members clampingly engage said wire portion and one of said bushing members clampingly engages said feed element to restrain movement of said elongate element with respect to said feed element.

* * * * *